United States Patent [19]

Takoshima et al.

[11] Patent Number: 4,737,742

[45] Date of Patent: Apr. 12, 1988

[54] UNIT CARRYING SURFACE ACOUSTIC WAVE DEVICES

[75] Inventors: Takehiro Takoshima; Takehiko Sone, both of Furukawa, Japan

[73] Assignee: Alps Electric Co., Ltd., Japan

[21] Appl. No.: 941,414

[22] Filed: Dec. 15, 1986

[30] Foreign Application Priority Data

Jan. 28, 1986 [JP] Japan .................................. 61-16094

[51] Int. Cl.[4] .................. H03H 9/05; H03H 9/10; H03H 9/42
[52] U.S. Cl. ............................. 333/150; 310/313 R; 310/342; 310/348; 333/193; 361/397; 361/412
[58] Field of Search ............... 333/194, 195, 196, 193, 333/150, 151, 152, 153, 154; 361/412, 395, 396, 397, 399, 400–406, 411, 418; 310/313 R, 313 A, 313 B, 313 C, 313 D; 364/821; 29/25.35; 174/68.5

[56] References Cited

U.S. PATENT DOCUMENTS

| | | | |
|---|---|---|---|
| 3,885,173 | 5/1975 | Lee | 333/150 X |
| 4,243,960 | 1/1981 | White et al. | 29/25.35 |
| 4,365,219 | 12/1982 | Nathan | 29/25.35 X |
| 4,617,487 | 10/1986 | Sone et al. | 310/313 B X |

FOREIGN PATENT DOCUMENTS

| | | | |
|---|---|---|---|
| 78935 | 6/1978 | Japan . | |
| 0014137 | 2/1979 | Japan | 333/194 |
| 0130613 | 8/1983 | Japan | 333/155 |
| 3957 | 1/1984 | Japan . | |
| 0244108 | 12/1985 | Japan | 333/193 |

Primary Examiner—Marvin L. Nussbaum
Attorney, Agent, or Firm—Guy W. Shoup

[57] ABSTRACT

A unit comprising a printed board on which a plurality of surface acoustic wave (SAW) devices are installed. Each SAW device comprises a piezoelectric substate on which arrays of strip electrodes are formed. A cover is mounted over the SAW devices to hermetically seal the surfaces of the SAW devices on which the electrodes are formed. The terminals of the board are directly coupled to the terminals of the SAW devices.

6 Claims, 2 Drawing Sheets

UNIT CARRYING SURFACE ACOUSTIC WAVE DEVICES

FIELD OF THE INVENTION

The present invention relates to a surface acoustic wave (SAW) device that finds use as a delay line, oscillator, filter, or the like.

BACKGROUND OF THE INVENTION

In the past, SAW devices were used in military, or special, applications. In recent years, SAW devices have found use in civil applications, such as FM tuners and TV receivers, and have attracted much interest rapidly. SAW devices are manufactured as delay lines, oscillators, filters, etc. The features of these various SAW devices are that they are small in size, light in weight, have high reliability, and can be fabricated by processes similar to those used in the case of integrated circuits. Hence, they can be easily mass-produced. Today, SAW devices are mass-produced as electronic parts indispensable to the industry.

By way of example of the prior art SAW device, a surface acoustic wave (SAW) resonator is now described. This resonator comprises a piezoelectric substrate on which arrays of strip electrodes made from an electrically conductive material are formed. Two similar lattice-like reflectors each consisting of dielectric substance, conductive substance, grooves, and ridges are formed on opposite sides of the electrode arrays. When a voltage of a certain frequency is applied to the electrodes, an electric field is applied to the surface of the piezoelectric substrate in the gaps between the electrodes. Then, a mechanical distortion is produced in proportion to the voltage because of the piezoelectricity of the piezoelectric substrate. The distortion propagates in both directions as surface waves at an acoustic velocity determined by the material of the piezoelectric substrate. The surface waves are reflected by the reflectors on both sides back to the strip electrodes, causing the electrodes to resonate.

Generally, these various SAW devices are hermetically sealed in metallic containers to remove external noise. Taking account of hermetic seal and resistance to errosion, the containers are usually plated with nickel or other metal.

In these SAW devices, conductive foreign matter intruded before the containers are hermetically sealed or matter peeling off from the plating of the containers may adhere to the strip electrodes, causing short circuits between the electrodes. This varies the electric impedance or presents other problems. As a result, the reliability of the SAW devices deteriorates, making it difficult to mass-produce them.

Japanese Patent Laid-Open No. 3957/1984 discloses an invention of a hermetically sealed electronic part package which comprises a circuit substrate, a vibrator installed on the substrate, and a casing mounted over the vibrator. Japanese Utility Model Laid-Open No. 78935/1978 discloses an SAW device comprising a piezoelectric substrate, electrodes formed on the substrate, a solder layer formed around the surface of the substrate on which the electrodes are formed, a sheetlike object having lead wires extending from the electrodes, and another solder layer formed around the sheetlike object. The sheetlike object is placed on, and bonded with adhesive to, the substrate.

In these SAW devices, the surface on which the electrodes are formed is hermetically sealed by the casing or sheetlike object. Therefore, a peripheral circuit for exciting the device must be formed on a separate substrate.

Also, the chips of SAW devices are generally very small. Therefore, where each individual SAW device is packaged, when they are installed on external circuits, a sufficient care must be taken, and the operation is performed with quite poor efficiency.

SUMMARY OF THE INVENTION

It is the object of the present invention to provide a unit which carries surface acoustic wave (SAW) devices thereon, can be fabricated with high reliability by preventing foreign matter from intruding into the devices, and which is easy to design and assemble so that peripheral circuits for driving the devices may also be incorporated into the devices.

The unit carrying SAW devices and fabricated in accordance with the present invention comprises: a plurality of SAW devices each having a piezoelectric substrate on which at least one pair of strip electrodes is formed; a single printed board on which the SAW devices are installed, the board having terminals that are directly coupled to the terminals of the SAW devices, the surface of each SAW device on which electrodes are formed being disposed opposite to the printed board; and a cover that hermetically seals the surfaces of the SAW devices on which the electrodes are formed.

In this way, in the novel unit, the SAW devices are installed on the printed board and hermetically sealed by the cover mounted over the devices. Therefore, short circuits between the electrodes which would have been caused by intrusion of conductive foreign matter, such as metal particles, can be prevented. Further, the SAW devices are installed on the single printed board, the terminals of the devices being directly coupled to the terminals of the printed board. Peripheral circuits for driving the devices are formed on the printed board to form a unit. This makes it easy to design and assemble the devices.

In a preferred embodiment of the invention, the surfaces of the SAW devices on which the electrodes are formed are covered with an insulating film. This effectively prevents conductive foreign matter from adhering to the devices; hence short circuits do not occur between the electrodes. Preferably, the material of the insulating film is at least one selected from the group consisting of $SiO_2$, $Si_3N_4$, $Ta_2O_5$, $Al_2O_3$, $ZrO_2$, $TiO_2$, and TaN. These materials can minimize the deterioration in characteristics of the SAW devices. In this case, the insulating film is preferably about 0.1 to 0.5 $\mu m$ thick.

In a further preferred embodiment of the invention, said printed board is a multilayer printed board. This makes it easy to form peripheral circuits for the devices.

DETAILED DESCRIPTION OF THE INVENTION

Figure 1:
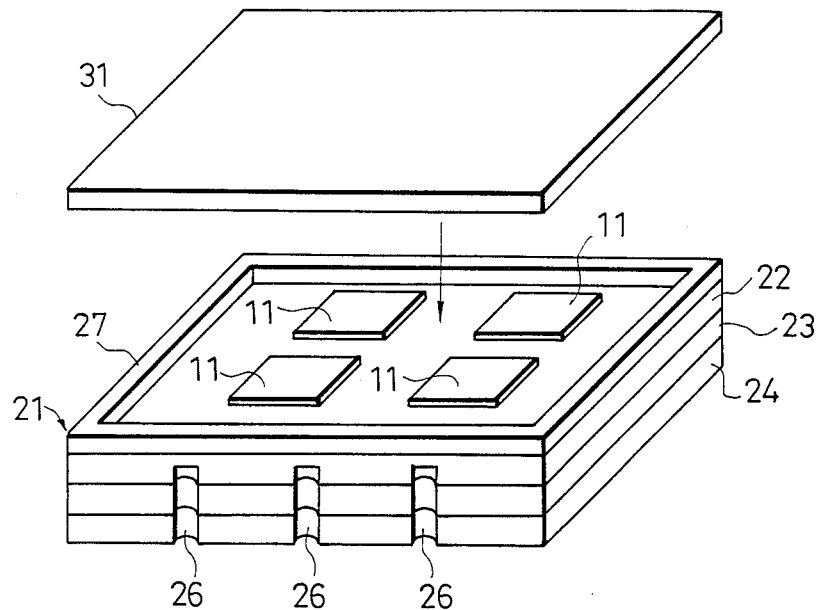
FIG. 1 is an exploded perspective view of a unit carrying SAW devices, the unit being fabricated in accordance with the invention.
Figure 2:
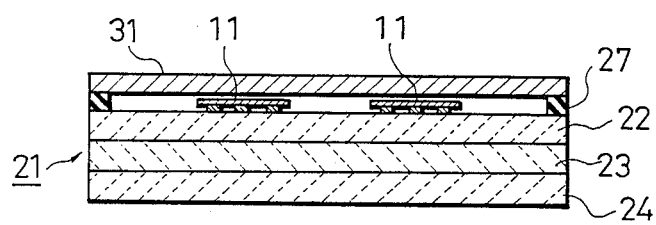
FIG. 2 is a fragmentary cross section of the unit shown in FIG. 1.
Figure 3:
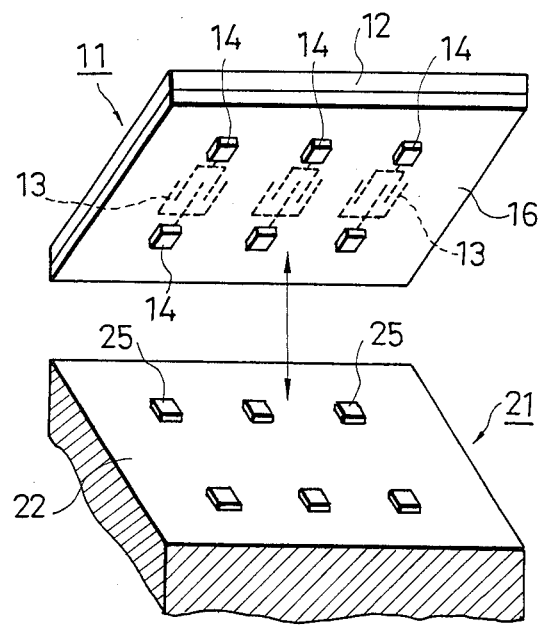
FIG. 3 is an enlarged perspective view of the portion of the unit shown in FIGS. 1 and 2 which carries the SAW devices.

Referring to FIGS. 1, 2, 3, there is shown a unit on which surface acoustic wave (SAW) devices are installed, the unit being fabricated in accordance with the invention. This unit comprises the SAW devices, indicated by reference numeral 11, a multilayer printed board 21, and a cover 31. As shown in FIG. 3, each SAW device 11 comprises a piezoelectric substrate 12 on which strip electrodes 13 are formed. Each electrode 13 has terminals 14. The surface of the substrate 12 on which the electrodes are formed is covered with an insulating film 16 except for the terminals 14.

The multilayer printed board 21 is a lamination of plural substrates, three substrates 22, 23, 24 in this example. Terminals 25 corresponding to the terminals 14 of the SAW device 11 are formed in position on the highest substrate 22. Circuit patterns constituting peripheral circuits (not shown) and including, for example, tuning and matching circuits, are formed on the substrates 22–24. Cutouts 26 which are semicircular in cross section are formed in one side surface of the board 21 so as to extend through the side surface. The holes 26 are provided with external terminals connected with, for example, the terminals of the substrates for connecting them to external circuits (not shown).

The terminals 14 of the SAW devices 11 are connected with the terminals 25 of the board 21 as by soldering. Thus, the plural SAW devices 11 are installed on the printed board 21. Preferably, a certain gap is left between the surface of the insulating film 16 on the SAW devices and the surface of the board 21. The requirement is only that the gap is more than approximately 1 $\mu$m.

A spacer 27 of a certain thickness is disposed on the fringe of the printed board 21. The cover 31 is bonded to the board 21 via the spacer 27, which hermetically seals the surface of the board on which the SAW devices 11 are installed. The cover 31 can consist of a ceramic plate. An adhesive made from glass, resin, or the like is used.

In this unit, the surface of the board on which the SAW devices 11 are installed is hermetically sealed by the cover 31. Further, the strip electrodes 13 on the SAW devices 11 are covered with the insulating film 16. Hence, adhesion of external conductive foreign matter can be effectively prevented. Hence, short circuits do not take place between the electrodes. This enhances the reliability of the devices. Also, since the terminals 25 of the multilayer printed board 21 are directly connected with the terminals 14 of the SAW devices 11 installed on the board 21, peripheral circuits can be formed on the printed board 21. Therefore, the devices are easy to design and assemble so that they may be connected with external circuits. Furthermore, peripheral circuits such as tuning coils can be installed on the board 21, as well as the SAW devices 11, in order to form a unit.

In the above example, the multilayer printed board 21 is used. Instead of this, a flexible printed circuit or the like may be employed. Also in the above example, the terminals 25 of the printed board 21 are coupled with solder to the terminals 14 of the devices 11. If the terminals 14 and 25 are made from aluminum, gold, or other material, they can be directly coupled together by thermocompression bonding.

As described thus far, in the novel unit, the SAW devices are installed on the printed board and hermetically sealed by the cover mounted over the devices. Therefore, conductive foreign matter does not adhere to the devices. Hence, short circuits do not occur between the electrodes. Since the terminals of the plural SAW devices are directly connected with the terminals of the single printed board on which the SAW devices are installed, peripheral circuits for driving the devices can be formed on the printed board, whereby a unit is formed. This makes it easy to design and assemble the devices.

What is claimed is:

1. A hermetically sealed unit for carrying surface acoustic wave devices, comprising:
   a printed circuit board having a substrate with a given surface area on which circuit patterns including circuit terminals are formed;
   a spacer layer provided on the periphery of the surface of the printed circuit board surrounding the surface area and circuit patterns thereon;
   a plurality of surface acoustic wave devices each having a piezoelectric substrate on which at least one pair of strip shaped electrodes with connecting terminals are formed, said devices being mounted on the surface of the printed circuit board with the connecting terminals thereof joined physically and electrically to corresponding circuit terminals of the circuit patterns thereon;
   a cover sealed by adhesive to the spacer layer on the printed circuit board for hermetically sealing the surface of the printed circuit board on which the surface acoustic wave devices are mounted; and
   a peripheral edge of the printed circuit board being formed with semicircular cutout portions provided with external terminals which are electrically connected to the circuit terminals of the circuit patterns and to the connecting terminals of the surface acoustic wave devices, thereby allowing the surface acoustic wave devices to be electrically connected to external circuits through said external terminals while maintaining the hermetic seal of said carrying unit.

2. A unit as set forth in claim 1, wherein the surfaces of the surface acoustic wave devices on which the electrodes are formed are covered with an insulating film except for the terminals.

3. A unit as set forth in claim 2, wherein the insulating film is made from at least one material selected from the group consisting of $SiO_2$, $Si_3N_4$, $Ta_2O_5$, $Al_2O_3$, $ZrO_2$, $TiO_2$, and $TaN$.

4. A unit as set forth claim 1 wherein the printed board is a multilayer printed board having laminated, printed circuit substrate layers.

5. A unit as set forth in claim 2, wherein the printed board is a multilayer printed board having laminated, printed circuit substrate layers.

6. A unit as set forth in any claim 3, wherein the printed board is a multilayer printed board having laminated, printed circuit substrate layers.

* * * * *